United States Patent
Hosokawa et al.

(10) Patent No.: US 10,199,547 B2
(45) Date of Patent: *Feb. 5, 2019

(54) RED PHOSPHOR AND LIGHT EMITTING DEVICE INCLUDING THE SAME

(71) Applicant: NICHIA CORPORATION

(72) Inventors: Shoji Hosokawa, Tokushima (JP); Masafumi Sakamoto, Anan (JP); Tomokazu Yoshida, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 147 days.

This patent is subject to a terminal disclaimer.

(21) Appl. No.: 15/485,377

(22) Filed: Apr. 12, 2017

(65) Prior Publication Data

US 2017/0222099 A1    Aug. 3, 2017

Related U.S. Application Data

(63) Continuation of application No. 14/724,118, filed on May 28, 2015, now Pat. No. 9,653,658.

(30) Foreign Application Priority Data

May 30, 2014  (JP) .................................. 2014-113515
May 11, 2015  (JP) .................................. 2015-096952

(51) Int. Cl.
*H01L 33/50*   (2010.01)
*C09K 11/77*   (2006.01)
(Continued)

(52) U.S. Cl.
CPC ........ *H01L 33/504* (2013.01); *C09K 11/0883* (2013.01); *C09K 11/665* (2013.01); *C09K 11/7731* (2013.01); *C09K 11/7734* (2013.01)

(58) Field of Classification Search
None
See application file for complete search history.

(56) References Cited

U.S. PATENT DOCUMENTS 2,748,303 A   5/1956   Thorington
2,851,425 A   9/1958   Thorington
(Continued)

FOREIGN PATENT DOCUMENTS

CN    104212458 A   12/2014
JP    H10-102054 A    4/1998
(Continued)

OTHER PUBLICATIONS

"Phosphor Handbook" edited by Phosphor Research Society, and published by Ohmsha, Ltd. (1987), pp. 104-105 and 230-231.
(Continued)

*Primary Examiner* — Walter H. Swanson
*Assistant Examiner* — Kien Ly
(74) *Attorney, Agent, or Firm* — Hunton Andrews Kurth LLP

(57) ABSTRACT

A red phosphor including the composition represented by the following general formula.

$$(x-a)MgO \cdot (a/2)Sc_2O_3 \cdot yMgF_2 \cdot cCaF_2 \cdot (1-b)GeO_2 \cdot (b/2)Mt_2O_3 : zMn^{4+}$$

where x, y, z, a, b, and c satisfy $2.0 \leq x \leq 4.0$, $0 < y < 1.5$, $0 < z < 0.05$, $0 \leq a < 0.5$, $0 < b < 0.5$, $0 \leq c < 1.5$, and $y+c < 1.5$, and Mt is at least one element selected from the group consisting of Al, Ga, and In.

7 Claims, 5 Drawing Sheets

(51) Int. Cl.
*C09K 11/66* (2006.01)
*C09K 11/08* (2006.01)

(56) References Cited

U.S. PATENT DOCUMENTS

| | | | |
|---|---|---|---|
| 3,671,452 | A | 6/1972 | Inoue et al. |
| 7,077,978 | B2 | 7/2006 | Setlur et al. |
| 9,653,658 | B2 * | 5/2017 | Hosokawa ............ H01L 33/502 |
| 2003/0155856 | A1 | 8/2003 | Shiiki et al. |
| 2005/0199897 | A1 | 9/2005 | Setlur et al. |
| 2006/0076883 | A1 * | 4/2006 | Himaki ............. C09K 11/0883 313/503 |
| 2007/0205712 | A1 * | 9/2007 | Radkov ............. C09K 11/0838 313/503 |
| 2008/0135860 | A1 | 6/2008 | Setlur et al. |
| 2008/0199728 | A1 | 8/2008 | Kim et al. |
| 2009/0072255 | A1 | 3/2009 | Takahashi et al. |
| 2011/0031874 | A1 * | 2/2011 | Hosokawa ......... C09K 11/0883 313/503 |
| 2011/0215709 | A1 | 9/2011 | Hiramatsu |
| 2011/0279011 | A1 | 11/2011 | Murphy et al. |
| 2012/0037933 | A1 * | 2/2012 | Roth .................. C09K 11/7734 257/88 |
| 2012/0187824 | A1 | 7/2012 | Yamakawa et al. |
| 2016/0276549 | A1 | 9/2016 | Yamashita et al. |
| 2016/0330806 | A1 | 11/2016 | Yamashita et al. |

FOREIGN PATENT DOCUMENTS

| | | |
|---|---|---|
| JP | 2001-026777 A | 1/2001 |
| JP | 2008-202044 A | 9/2008 |
| JP | 2009-528429 A | 8/2009 |
| JP | 2011-006501 A | 1/2011 |
| JP | 2011006501 A * | 1/2011 |
| JP | 2011-178960 A | 9/2011 |
| JP | 2015-113431 A | 6/2015 |
| WO | 2007/100824 A2 | 9/2007 |

OTHER PUBLICATIONS

Office Action dated Jan. 24, 2017 in Japanese Application No. 2015-096952 (includes English translation).

* cited by examiner

RED PHOSPHOR AND LIGHT EMITTING DEVICE INCLUDING THE SAME

CROSS-REFERENCE TO RELATED APPLICATIONS

This is a continuation application based on U.S. patent application Ser. No. 14/724,118, filed May 28, 2015, which claims priority under 35 U. S. C. § 119 to Japanese Patent Applications No. 2014-113,515, filed May 30, 2014, and No. 2015-096,952, filed May 11, 2015. The contents of these applications are incorporated herein by reference in their entirety.

BACKGROUND OF THE INVENTION

1. Field of the Invention

The present invention relates to a phosphor that can be excited by light having a peak wavelength in the range from near-ultraviolet light to visible light and can efficiently emit red light, and a light emitting device using this phosphor.

2. Description of the Related Art

Light emitting diodes are semiconductor light emitting elements formed of semiconductor materials such as gallium nitride (GaN). Various types of light emitting devices have been developed which include semiconductor light emitting elements and phosphors for emitting white light, electric bulb color light, orange light, and the like. The light emitting devices for emitting white light, and the like can be designed based on the additive color mixture principle. Two types of white light emitting devices are well known. One type of white light emitting devices includes an ultraviolet light emitting element, and three types of phosphors that emit red (R) light, green (G) light and blue (B) light. Another type of white light emitting devices includes a blue light emitting element, and a phosphor that emits yellow light, or the like. White light emitting devices are required in various applications such as ordinary lighting, automobile lighting, display, liquid crystal display backlight, and the like. In particular, high color purity as well as light emission efficiency is required for phosphors used in the display application in order to reproduce colors in the wide regions on the chromaticity coordinates. Since phosphors used in the display application are demanded to have suitability for a color filter to be used in combination with the phosphors, their half-value width of the peak light emission is necessarily narrow.

As a red phosphor that is excited by light in the blue range and has a narrow half-value width, for example, a fluoride phosphor is known which has a composition of $K_2SiF_6$:$Mn^{4+}$, $K_2TiF_6$:$Mn^{4+}$, $K_2SnF_6$:$Mn^{4+}$, $Na_2TiF_6$:$Mn^{4+}$, $Na_2ZrF_6$:$Mn^{4+}$, $K_2Si_{0.5}Ge_{0.5}F_6$:$Mn^{4+}$, or the like (see Japanese Patent Laid-Open Publication No. JP 2009-528,429 A1, for example).

It can be considered that a phosphor represented by the composition of $3.5MgO \cdot 0.5MgF_2 \cdot GeO_2$:$Mn^{4+}$ (See "Phosphor Handbook" edited by Phosphor Research Society, and published by Ohmsha, Ltd. (1987), for example. Hereinafter, the phosphor is occasionally referred to as "MGF phosphor") is another possible red phosphor which can be used together with the above red phosphor or used alone for the same purpose.

Although the MGF phosphor is known as a red phosphor for mercury-vapor lamps, it can be also excited by a light emitting diode that emits light having a peak wavelength in the range from near-ultraviolet light to visible light (350 to 500 nm) as an excitation light source.

The MGF phosphor can be produced by calcination at about 1200° C. and normal atmospheric pressure in the air. Accordingly, there is an advantage that the MGF phosphor can be relatively easily manufactured.

In recent years, red phosphors have been developed which are obtained by substituting $MgF_2$ in the composition of the MGF phosphor with other fluoride $AF_2$, where A is at least one element selected from the group consisting of Ca, Sr, Ba, and Zn (see Japanese Patent Laid-Open Publication No. JP 2008-202,044 A1, for example). According to JP 2008-202,044 A1, the phosphors can have 150% of the light emission efficiency of the conventional MGF phosphor at the maximum.

In the case where the MGF phosphor is used for the liquid crystal display backlight, or the like, the persistence characteristics of the phosphor are important. In particular, in this case, short persistence time is required. For example, in the case where local dimming is used in a liquid crystal display, high speed of response is required. If the persistence time of phosphor is long, the refresh rate of the display may be low. Here, the persistence time of MGF phosphor is relatively longer than other phosphors.

It is said that the conventional MGF phosphor is efficiently excited by light having a wavelength of about 254 nm. However, in recent years, mercury free, and the like are demanded. For this reason, light emitting diodes are becoming widely used as ultraviolet excitation light sources instead of mercury-vapor lamps, or the like. Correspondingly, the MGF phosphor is required to efficiently emit luminescent radiation even when using the light emitting diodes that emit light having a peak wavelength in the range from near-ultraviolet light to visible light, which is longer than the wavelength of the mercury-vapor lamps. In addition, the persistence time is necessarily short for the MGF phosphor as stated above.

The present invention is devised to solve the above problems. It is a main object of the present invention to provide a red phosphor that can efficiently emit luminescent radiation even when excited by light having a peak wavelength in the range from near-ultraviolet light to visible light while maintaining the fundamental characteristics of the conventional MGF phosphor, and has short-persistence-time characteristics, and a light emitting device including the red phosphor.

SUMMARY OF THE INVENTION

In order to achieve the aforementioned object, a red phosphor according to one aspect of the present invention includes the composition represented by following the general formula (I):

$$(x-a)MgO \cdot (a/2)Sc_2O_3 \cdot yMgF_2 \cdot cCaF_2 \cdot (1-b)GeO_2 \cdot (b/2)Mt_2O_3 : zMn^{4+} \quad (I)$$

where x, y, z, a, b, and c satisfy $2.0 \leq x \leq 4.0$, $0 < y < 1.5$, $0 < z < 0.05$, $0 \leq a < 0.5$, $0 < b < 0.5$, $0 \leq c < 1.5$, and $y+c < 1.5$, and Mt is at least one element selected from the group consisting of Al, Ga, and In.

A red phosphor according to one aspect of the present invention can be excited by light having a peak wavelength in the range from near-ultraviolet light to visible light, and have persistence time shorter than the conventional MGF phosphor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF EMBODIMENTS

Figure 1:
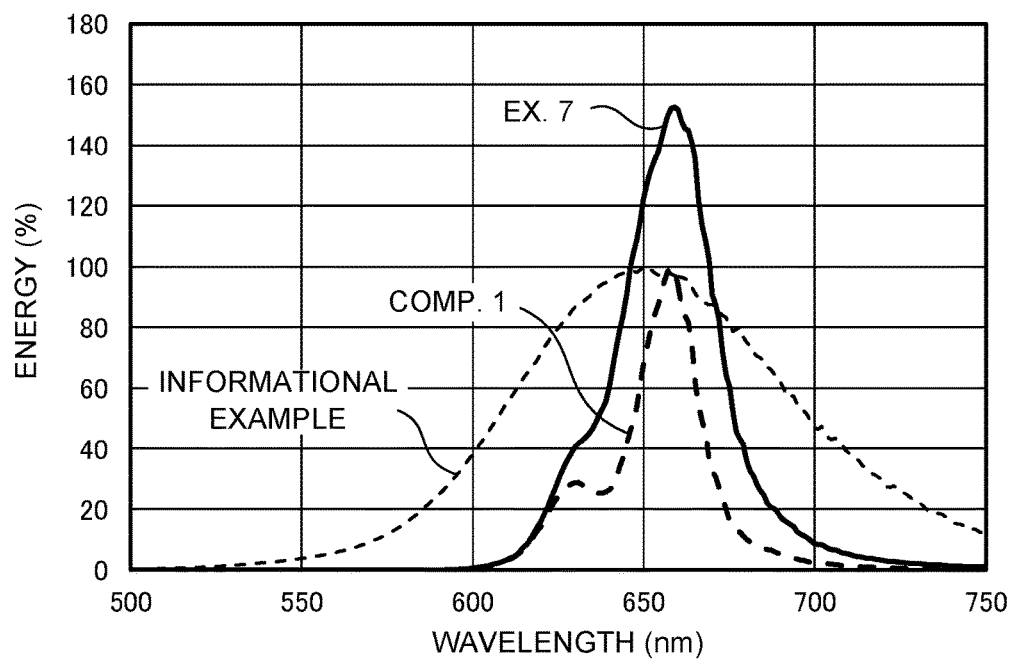
FIG. 1 is a graph showing the light emission spectrums of a red phosphors according to an example 7 of the present invention, and phosphors according to a comparative example 1 and an informational example.

The embodiments will now be described with reference to the accompanying drawings, wherein like reference numerals designate corresponding or identical elements throughout the various drawings.

It should be appreciated, however, that the embodiments described below are illustrations of a red phosphor, and a light emitting device that includes the red phosphor to give a concrete form to technical ideas of the invention, and a red phosphor, and a light emitting device that includes the red phosphor of the invention are not specifically limited to description below.

In description of the present invention, relationship between color name and chromaticity coordinates, relationship between light wavelength range and name of monochromatic light, and the like are based on the JIS standard (JIS Z8110). Specifically, a range of 380 to 410 nm corresponds to violet, a range of 410 to 455 nm corresponds to bluish violet, a range of 455 to 485 nm corresponds to blue, a range of 485 to 495 nm corresponds to bluish green, a range of 495 to 548 nm corresponds to green, a range of 548 to 573 nm corresponds to yellowish green, a range of 573 to 584 nm corresponds to yellow, a range of 584 to 610 nm corresponds to apricot, and a range of 610 to 780 nm corresponds to red.

For the purpose of improving the luminescent radiation (light emission) efficiency of the MGF phosphor when the MGF phosphor is excited by light having a peak wavelength in the range from near-ultraviolet light to visible light, preferably from 350 to 500 nm, and of reducing its persistence time, the inventors study the MGF phosphor, and have found that the purposes can be achieved by changing the composition ratio of the elements of the MGF phosphor, or by substituting the element of the MGF phosphor with other element.

JP 2008-202,044 A1 discloses a phosphor which is obtained by substituting $MgF_2$ in the composition of the MGF phosphor, which is represented by the composition of $3.5MgO.0.5MgF_2.GeO_2:Mn^{4+}$, with other fluoride $AF_2$ (A is at least one element selected from the group consisting of Ca, Sr, Ba, and Zn). According to JP 2008-202,044 A1, this phosphor has a high light emission efficiency improved up to 150% at maximum, as compared with the conventional MGF phosphor.

Contrary to this, the inventors have found that the light emission efficiency of red phosphors according to the embodiments of the present invention can be improved which are produced by partially substituting the element Mg of MgO in the composition of the MGF phosphor with other element such as Li, Na, K, Sc, Y, La, Ce, Pr, Nd, Pm, Sm, Eu, Gd, Tb, Dy, Ho, Er, Tm, Yb, Lu, V, Nb, Ta, Cr, Mo, or W, or by partially substituting the element Ge of $GeO_2$ with other element such as B, Al, Ga or In. In addition, the inventors have found that the light intensity of a phosphor in the wavelength range from 600 to 670 nm can be improved to greater than 200% of the conventional MGF phosphor by substituting both the elements Mg and Ge with other elements.

<Phosphor>

The following description will describe red phosphors according to embodiments of the present invention.

The red phosphors according to the embodiments of the present invention include the composition represented by following the general formula (I):

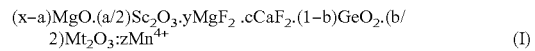

$$(x-a)MgO.(a/2)Sc_2O_3.yMgF_2.cCaF_2.(1-b)GeO_2.(b/2)Mt_2O_3:zMn^{4+} \quad (I)$$

where x, y, z, a, b, and c satisfy $2.0 \leq x \leq 4.0$, $0 < y < 1.5$, $0 < z < 0.05$, $0 \leq a < 0.5$, $0 < b < 0.5$, $0 \leq c < 1.5$, and $y+c<1.5$. Mt is at least one element selected from the group consisting of Al, Ga, and In. In the above general formula (I), in the case where b satisfies $0.05 \leq b < 0.5$, the persistence time of the phosphor can be short. Also, in the case where a and b satisfy $0.05 \leq a \leq 0.3$ and $0.05 \leq b < 0.3$, the persistence time of the phosphor can be short, and the light intensity of the phosphor can be improved.

In the red phosphor according to this embodiment, it is preferable that the persistence time be not greater than 6.5 msec from a reference point to the point at which the light intensity of the red phosphor becomes 1/10 of the light intensity at the reference point. Alternatively, it is preferable that the persistence time be not greater than 13.5 msec from a reference point to the point at which the light intensity of the red phosphor becomes 1/100 of the light intensity at the reference point.

FIG. 1 is a graph showing the emission spectrums of the conventional phosphor $3.5MgO.0.5MgF_2.GeO_2:0.15Mn^{4+}$ as a comparative example 1, a phosphor $CaAlSiN_3:Eu^{2+}$ as an informational example, and a phosphor having the composition of
$3.4MgO.0.05Sc_2O_3.0.5MgF_2.0.885GeO_2.0.05Ga_2O_3:$
$0.015Mn^{4+}$ as the red phosphor according to the embodiment (as an example 7 of the present invention discussed later) for comparison. The short dashed line, long dashed line, and solid line show the informational example, the comparative example 1, and the example 7, respectively.

Figure 2:
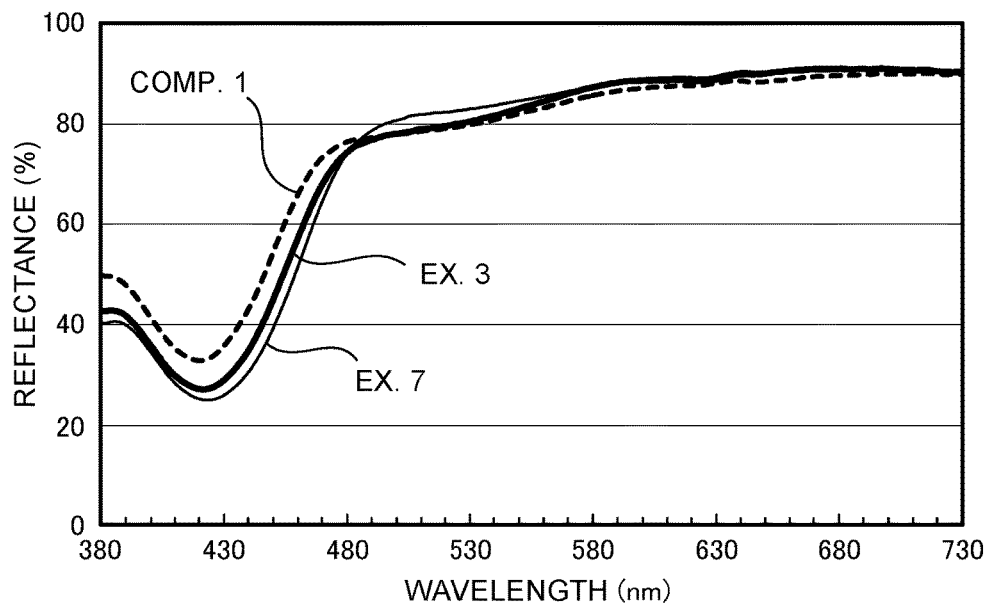
FIG. 2 is a graph showing the reflectance spectrums of red phosphors according to examples 3 and 7 of the present invention, and the phosphor according to the comparative example 1.
Figure 3:
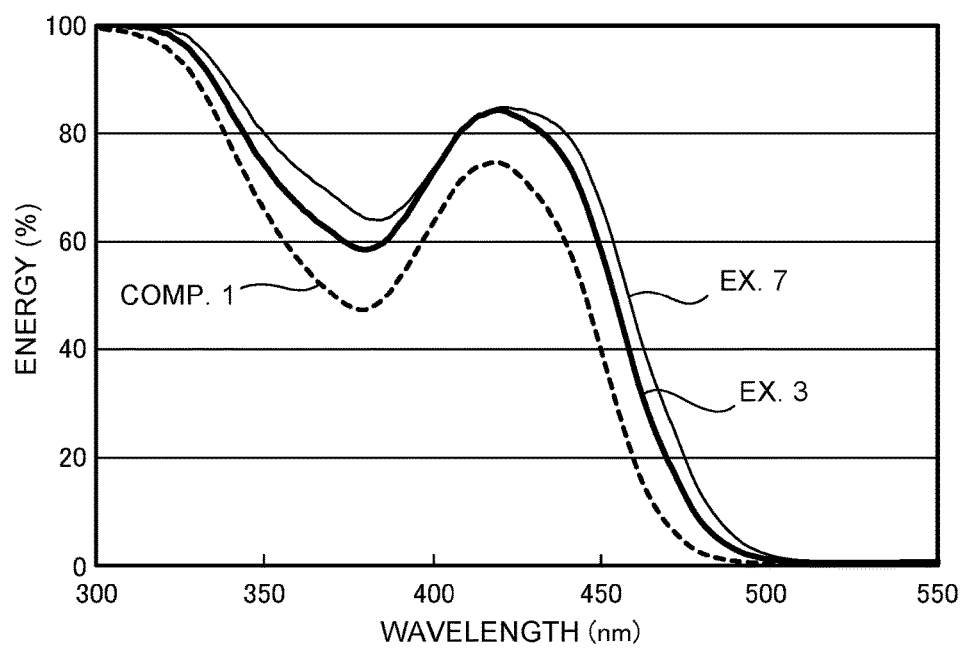
FIG. 3 is a graph showing the excitation spectrums of the red phosphors according to the examples 3 and 7 of the present invention, and the phosphor according to the comparative example 1.

FIG. 2 is a graph showing the reflectance spectrums of red phosphors according to the embodiments (as examples 3 and 7 of the present invention discussed later), and the phosphor according to the comparative example 1. FIG. 3 is a graph showing the excitation spectrums of the red phosphors according to the embodiments (as the examples 3 and 7 of the present invention discussed later), and the phosphor according to the comparative example 1. The dashed line, thick solid line, and thin solid line show the comparative example 1, and the example, and the example 7, respectively.

The red phosphors according to the embodiments are excited by light from 350 to 500 nm in the near-ultraviolet and the visible ranges as shown in FIG. 1, and emit light having light emission spectrums with peak wavelengths in the range from 600 to 670 nm as shown in FIG. 3. As shown in FIG. 1, the red phosphor according to the embodiment emits light having the light emission spectrum with a half-value width smaller than the phosphor $CaAlSiN_3:Eu^{2+}$ as the informational example also shown as the solid line in FIG. 1. Since the half-value width of the red phosphor according to the embodiment in its light emission spectrum is smaller than the phosphor $CaAlSiN_3:Eu^{2+}$ as the informational example, the red phosphor according to the embodiment is suitable for red phosphors used for backlight uses in liquid crystal displays that are demanded to have suitability for their color filters to be used in combination with the phosphors.

As stated above, the conventional MGF phosphor efficiently emits light when excited by the emission line of a mercury-vapor lamp approximately 254 nm, which is shorter than near-ultraviolet light and blue light.

Contrary to this, the light intensity of the red phosphor according to the embodiment, which is obtained by changing the composition ratio of MgO or $MgF_2$ in the composition of the conventional MGF phosphor or by partially substituting the element Mg or Ge with other element, is reduced when excited by light with approximately 254 nm but is increased when excited by near-ultraviolet light or blue light.

The red phosphor having the composition represented by the above general formula (I) is a phosphor that is obtained by changing the composition ratio of the elements of the conventional MGF phosphor, which is represented by the composition formula of $3.5MgO.0.5MgF_2.GeO_2:0.15Mn^{4+}$, by partially substituting the element Mg or Ge of the conventional MGF phosphor with other element, or by adding $CaF_2$ into the composition of the conventional MGF phosphor.

In the red phosphor, Ge is substituted with at least one element selected from the group consisting of Al, Ga, and In. In particular, Ge is preferably substituted with Al or Ga, more preferably with Ga.

In the red phosphors according to the embodiments, it is preferable that the particle diameter fall within the range from 5 to 30 μm. In addition, the red phosphors according to the embodiments preferably include a crystal phase the percentage of which is not less than 50% by weight.

<Light Emitting Device>

A light emitting device according to an embodiment of the present invention includes an excitation light source that emits light having a peak wavelength in the wavelength range from 380 to 485 nm, and the red phosphor. The light emitting device can additionally include other components on an as needed basis. The light emitting device is not specifically limited but can be suitably applied to known light emitting devices. For example, the light emitting device can be applied to a display, a monitor (e.g., radar monitor), a light source for liquid crystal displays, or the like.

(Excitation Light Source)

The excitation light source for exciting the phosphor emits light having a peak wavelength in the wavelength range from 380 to 485 nm, which corresponds to a shorter wavelength range in the visible light. The excitation light source preferably has a light emission peak wavelength in the wavelength range from 400 to 470 nm, more preferably from 410 to 460 nm. Since the red phosphor can be efficiently excited by light in the visible range, the visible light components of the excitation light source can be effectively used. In the case where an excitation light source having a light emission wavelength falling within the above range, the light emitting device can have a high light intensity.

A semiconductor light emitting element (hereinafter, occasionally referred to simply as a "light emitting element") is preferably used as the excitation light source. In the case where the semiconductor light emitting element is used as the excitation light source, it is possible to provide a highly efficient and stable light emitting device that has high linearity and high mechanical shock resistance. Light emitting elements capable of emitting light in the short wavelength visible range can be used as the excitation light source. For example, a light emitting element that is formed of nitride group semiconductors ($In_xAl_yGa_{1-x-y}N$, 0≤x, 0≤y, x+y≤1) can be used as a blue or green light emitting element.

(Phosphor)

The light emitting device according to this embodiment includes phosphors. One of the phosphors is the red phosphor stated above. The phosphors, which are included in the light emitting device according to this embodiment, can be contained as a component of the light emitting device in a sealing resin that covers the excitation light source. In the case where the light emitting device includes the sealing resin which contains the red phosphor and covers the excitation light source, the red phosphor absorbs a part of light that is emitted from the excitation light source, and emits red light. When the excitation light source emits light in the wavelength range from 380 to 485 nm, the light emitted by this excitation light source can be more effectively used. Accordingly, the loss of light that is emitted by the light emitting device can be reduced. Therefore, the light emitting device can have high efficiency.

The content of the phosphor included in the light emitting device is not specifically limited. The content of the phosphor can be suitably selected depending on the excitation light source, and the like.

(Other Phosphor)

The light emitting device preferably additionally includes other phosphor as a second phosphor that can emit luminescent radiation with a peak wavelength different from the red phosphor according to this embodiment as a first phosphor. The aforementioned other phosphor is not specifically limited as long as it absorbs the light from the light emitting element and emits luminescent radiation with a wavelength different from the red phosphor. For example, the aforementioned other phosphor can be contained as a component of the light emitting device in the sealing resin.

For example, it is preferable that the aforementioned other phosphor be at least one material selected from the group consisting of a nitride group fluorescent material, a nitride oxide group fluorescent material and a SIALON group fluorescent material that are mainly activated with lanthanoide series elements such as Eu and Ce; an alkaline-earth halogen apatite fluorescent material, an alkaline-earth-metal boric-acid halogen fluorescent material, an alkaline-earth-metal aluminate fluorescent material, an alkaline-earth silicate fluorescent material, an alkaline-earth sulfide fluorescent material, an alkaline-earth thiogallate fluorescent material, an alkaline-earth silicon nitride fluorescent material and a germanate fluorescent material that are mainly activated with lanthanoide series elements such as Eu, or transition-metal series elements such as Mn; a rare earth aluminate fluorescent material and a rare earth silicate fluorescent material that are mainly activated with lanthanoide series elements such as Ce; and an organic material and organic complex that are mainly activated with lanthanoide series elements such as Eu.

Examples of the aforementioned other phosphors can be provided by $(Ca, Sr, Ba)_2SiO_4$:Eu, $(Y, Gd)_3(Ga, Al)_5O_{12}$:Ce, $Si_{6-w}Al_wO_wN_{8-w}$:Eu $(0<w\leq4.2)$ (β-SIALON), $SrGa_2S_4$:Eu, $K_2(Si, Ge, Ti)F_6$:$Mn^{4+}$, $(Ca, Sr, Ba)_2Si_5N_8$:Eu, $(Ca, Sr)AlSiN_3$:Eu, $Lu_3Al_5O_{12}$:Ce, $(Ca, Sr, Ba)_8MgSi_4O_{16}Cl_2$:Eu, $(Ba, Sr, Ca)_3MgSi_2O_8$:Eu, $BaMgAl_{10}O_{17}$:Eu, $(Ca, Sr)_5(PO_4)_3(F, Cl, Br)$:Eu, and the like.

In the case where other phosphor is included, the color of light emitted by the light emitting device can be adjusted to various colors. The content of the aforementioned other phosphor is not specifically limited. The content of the aforementioned other phosphor can be suitably adjusted to obtain desired light emission characteristics.

In the case where the light emitting device additionally includes other phosphor, a green phosphor is preferably included as the aforementioned other phosphor. In particular, a green phosphor that absorbs light in the wavelength range from 380 to 485 nm and emits light in the wavelength range from 495 to 573 nm is more preferably included as the aforementioned other phosphor. In the case where the light emitting device includes such a green phosphor, the light emitting device can be more suitably applied to liquid crystal displays.

The type of the light emitting device is not specifically limited. The light emitting device can have any suitable type selected from conventional types of light emitting devices. Exemplary types of light emitting devices can be provided by a bullet type, a surface mount type, and the like. The bullet type light emitting device typically refers to a light emitting device that has a bullet-shaped resin forming its external surface. The surface mount type light emitting device refers to a light emitting device including a light emitting element as the excitation light source and a resin member which are accommodated in a recessed accommodation part. Another exemplary type of light emitting device can be provided by a light emitting device that includes a light emitting element as the excitation light source, a plate-shaped circuit board on which the light emitting element is mounted, and a sealing member which contains phosphors and is formed in a lens shape or the like.

Figure 4:
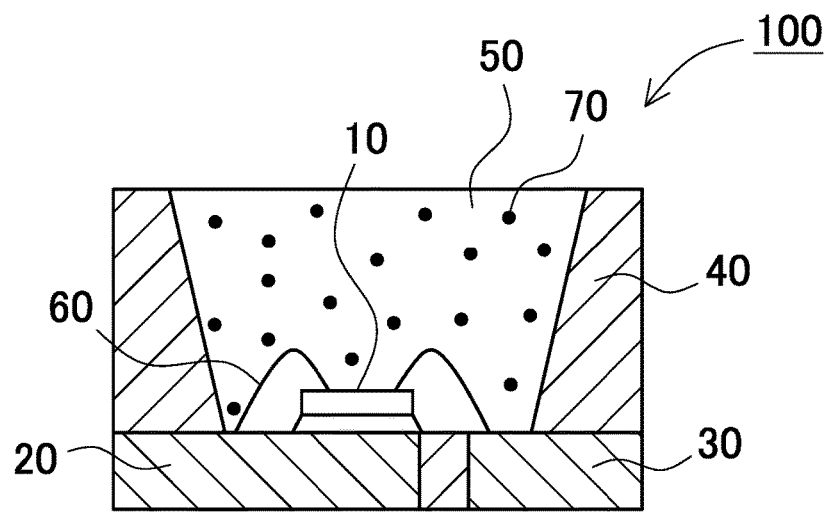
FIG. 4 is a schematic cross-sectional view showing a light emitting device according to an embodiment of the present invention.
Figure 5:
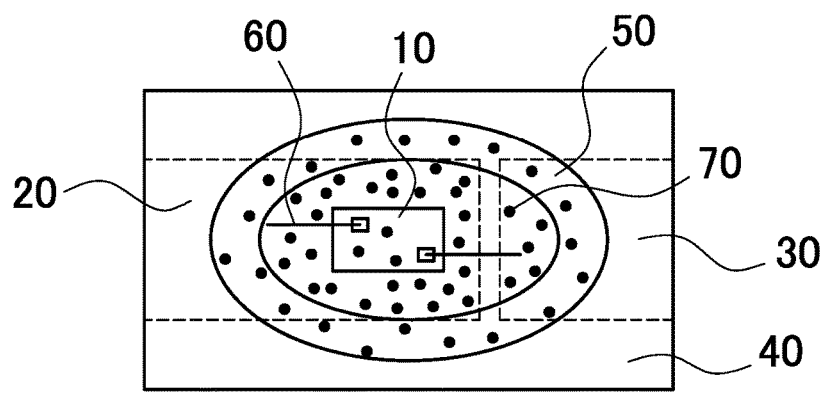
FIG. 5 is a schematic plan view showing the light emitting device according to the embodiment of the present invention.

The light emitting device according to this embodiment of the present invention is now described with reference to the drawings. FIG. 4 is a schematic cross-sectional view showing the light emitting device according to this embodiment. FIG. 5 is a schematic plan view showing the light emitting device according to this embodiment. This light emitting device is an exemplary surface mount type light emitting device.

The light emitting device 100 includes a light emitting element 10 which is formed of gallium nitride group semiconductors and emits light in the short wavelength range of the visible light (e.g., 380 to 485 nm), and a molded member 40 which accommodates the light emitting element 10. The molded member 40 includes first and second lead terminals 20 and 30. The molded member is integrally formed with the terminals, and is formed of a thermoplastic resin or thermosetting resin. The molded member 40 has a recessed part which is surrounded by the bottom and side surfaces. The light emitting element 10 is placed on the bottom surface of the recessed portion. The light emitting element 10 includes a pair of electrodes (positive and negative electrodes). The pair of electrodes (positive and negative electrodes) are electrically connected to the first and second lead terminals 20 and 30 through wires 60. The light emitting element 10 is covered by the sealing member 50. It is preferable that the sealing member 50 be formed of a thermosetting resin (e.g., epoxy resin, silicone resin, epoxy-denatured silicone resin, and denatured silicone resin). The sealing member 50 contains the red phosphor 70, which converts light having a wavelength from the light emitting element 10 into light having a wavelength different from the light having a wavelength from the light emitting element.

The following description will describe phosphors according to examples of the present invention. Needless to say, the present invention is not limited to the examples described below.

COMPARATIVE EXAMPLES 1 AND 2, AND EXAMPLES 1 TO 8

Predetermined weights of MgO, $MgF_2$, $Sc_2O_3$, $GeO_2$, $Ga_2O_3$, and $MnCO_3$ as materials are first measured. After the materials are mixed, the mixed materials are placed in a crucible. Subsequently, the mixed materials are burned at a temperature falling within the range from 1000° to 1300° C. for six hours. Phosphors according to the comparative examples 1 and 2, and the examples 1 to 8 are produced by the aforementioned processes. The composition formulas of the phosphors according to the examples are shown in Table 1.

The phosphor according to the comparative example 1 is the phosphor for mercury-vapor lamps disclosed in "Phosphor Handbook" edited by Phosphor Research Society and published by Ohmsha, Ltd. (1987). The composition of the phosphor according to the comparative example 1 is represented by $3.5MgO \cdot 0.5MgF_2 \cdot GeO_2:0.015Mn^{4+}$.

TABLE 1

|  | Sub. Elem. | Composition Formula |
|---|---|---|
| Comp. 1 |  | $3.5MgO \cdot 0.5MgF_2 \cdot GeO_2:0.015Mn^{4+}$ |
| Ex. 1 | Ga | $3.5MgO \cdot 0.5MgF_2 \cdot 0.98GeO_2 \cdot 0.0025Ga_2O_3:0.015Mn^{4+}$ |
| Ex. 2 | Ga | $3.5MgO \cdot 0.5MgF_2 \cdot 0.935GeO_2 \cdot 0.025Ga_2O_3:0.015Mn^{4+}$ |
| Ex. 3 | Ga | $3.5MgO \cdot 0.5MgF_2 \cdot 0.885GeO_2 \cdot 0.05Ga_2O_3:0.015Mn^{4+}$ |
| Ex. 4 | Ga | $3.5MgO \cdot 0.5MgF_2 \cdot 0.685GeO_2 \cdot 0.15Ga_2O_3:0.015Mn^{4+}$ |
| Ex. 5 | Sc, Ga | $3.495MgO \cdot 0.0025Sc_2O_3 \cdot 0.5MgF_2 \cdot 0.98GeO_2 \cdot 0.0025Ga_2O_3:0.015Mn^{4+}$ |
| Ex. 6 | Sc, Ga | $3.45MgO \cdot 0.025Sc_2O_3 \cdot 0.5MgF_2 \cdot 0.935GeO_2 \cdot 0.025Ga_2O_3:0.015Mn^{4+}$ |
| Ex. 7 | Sc, Ga | $3.4MgO \cdot 0.05Sc_2O_3 \cdot 0.5MgF_2 \cdot 0.885GeO_2 \cdot 0.05Ga_2O_3:0.015Mn^{4+}$ |
| Ex. 8 | Sc, Ga | $3.2MgO \cdot 0.15Sc_2O_3 \cdot 0.5MgF_2 \cdot 0.685GeO_2 \cdot 0.15Ga_2O_3:0.015Mn^{4+}$ |
| Comp. 2 | Sc, Ga | $3.0MgO \cdot 0.25Sc_2O_3 \cdot 0.5MgF_2 \cdot 0.485GeO_2 \cdot 0.25Ga_2O_3:0.015Mn^{4+}$ |

<Measurement of Powder Characteristics>

The light intensity of the phosphor powder according to each of the comparative examples 1 and 2, and the examples 1 to 8 is measured at a wavelength of excitation light 440 nm by Fluorescence Spectrophotometer F-4500 (manufactured by Hitachi High-Technologies Corporation). Table 2 shows relative energy values (relative ENG) of the measured light emission spectrums as the light intensity.

Figure 6:
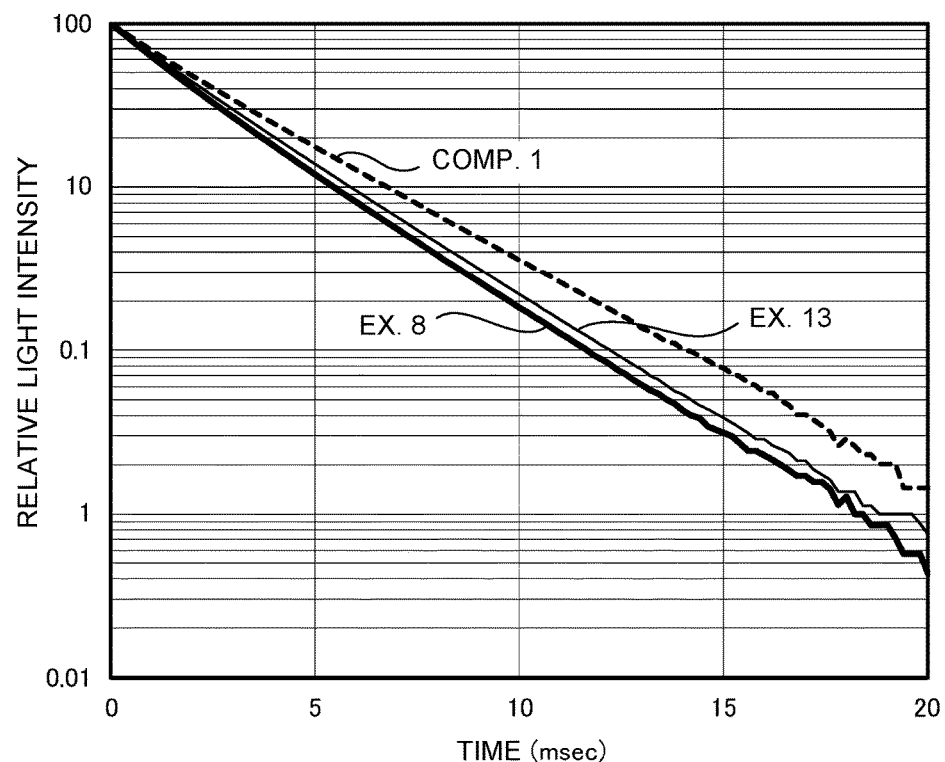
FIG. 6 is a graph showing the persistence characteristics of red phosphors according to examples 8 and 13 of the present invention, and the phosphor according to the comparative example 1.

In evaluation of persistence time of each phosphor, the light intensity of the phosphor at a wavelength of 650 nm is first measured by Fluorescence Spectrophotometer F-4500 (manufactured by Hitachi High-Technologies Corporation) when excited by excitation light having a wavelength of 450 nm. That is, the variation of light intensity is measured from the point in time when the irradiation of the phosphor with excitation light is stopped (reference point). As for the persistence time of each of the phosphors according to the examples, time periods until the light intensity become $1/10$ and $1/100$ of the light intensity at the excitation light cut-off point (reference point) are calculated where the light intensity at the excitation light cut-off point is defined as 100%. Table 2 also shows the results of persistence time. FIG. 6 is a graph showing the persistence characteristics of the phosphors according to the examples 8 and 13, and the comparative example 1. In FIG. 6, the thick solid line, the thin solid line, and the dashed line show the example 8, the example 13, and the comparative example 1, respectively.

The particle diameter values are mean particle diameters measured by air permeation method in F.S.S.S.No. (Fisher Sub Sieve Sizer's No.). Specifically, 1 cm³ of a sample is measured under environmental conditions at temperature of 25° C. and humidity of 70%, and is placed in a special tubular vessel. Subsequently, air flows through the vessel at a constant pressure. Thus, a relative surface area value is obtained based on the pressure difference. The mean particle diameter value is obtained by conversion from the relative surface area value.

tion, the persistence time periods to $1/10$ and $1/100$ of the phosphors according to the examples 1 to 4 are reduced to not longer than 6.5 msec and 13.5 msec by the substitution of Ge with Ga. Accordingly, it is found that the light intensity can be increased, and the persistence time can be reduced by the substitution of Ge with Ga. Also, it is found that the persistence time of the phosphor can be shorter in the case where b satisfies $0.05 \leq b < 0.5$ in the above general formula (I).

The phosphors according to the examples 5 to 8, and the comparative example 2 are produced by partially substituting Mg of MgO and Ge of $GeO_2$ in the elements of the MGF phosphor with Sc and Ga, respectively. As shown in Table 2, it is found that the light emission values of the phosphors according to the examples 5 to 8 are increased by the substitution of Mg and Ge with Sc and Ga as compared with the phosphors according to the comparative example the elements of which are substituted with neither Sc nor Ga. In addition, it is found that the light emission values of the phosphors according to the examples 5 to 8 are increased by the substitution of Mg and Ge with Sc and Ga as compared with the examples 1 to 4, which are subjected to the substitution of Ge with only Ga. However, it is found that the light emission values of the phosphors according the comparative example 2 is reduced which is subjected to the substitution of a large content of Mg and Ge with Sc and Ga. Also, the persistence time periods of the examples 5 to 8 are reduced as compared with the comparative example 1 similar to the examples 1 to 4. Also, it is found that the persistence time of the phosphor can be shorter, and the light intensity of the phosphor can be higher in the case where a and b satisfy $0.05 \leq a \leq 0.3$ and $0.05 \leq b < 0.3$ in the above general formula (I).

TABLE 2

| | Change in Composition | | | | | | | | Powder Characteristics | | | |
|---|---|---|---|---|---|---|---|---|---|---|---|---|
| | Mole Ratio (mol) | | | | | | | | 440 nm | | | |
| | MgO-Site | | | | | GeO₂-Site | | | | Rel. | | |
| | MgO | Sub. | | MgF₂ | CaF₂ | GeO₂ | Sub. | | Mn⁴⁺ | Mean | ENG | Persistence |
| | x-a | Elem. | a | y | c | 1-b | Elem. | b | z | Dia./μm | (%) | 1/10 | 1/100 |
| Comp. 1 | 3.5 | — | — | 0.5 | — | 0.985 | — | — | 0.015 | 10.2 | 100 | 6.8 | 14.0 |
| Ex. 1 | 3.50 | — | — | 0.5 | — | 0.98 | Ga | 0.005 | 0.015 | 9.9 | 102 | 6.2 | 13.0 |
| Ex. 2 | | | | | | 0.935 | | 0.05 | | 11.2 | 145 | 5.8 | 12.4 |
| Ex. 3 | | | | | | 0.885 | | 0.1 | | 12.4 | 160 | 5.4 | 11.6 |
| Ex. 4 | | | | | | 0.685 | | 0.3 | | 11.8 | 117 | 4.8 | 10.4 |
| Ex. 5 | 3.495 | Sc | 0.005 | | | 0.98 | | 0.005 | | 10.0 | 105 | 6.2 | 12.8 |
| Ex. 6 | 3.45 | | 0.05 | | | 0.935 | | 0.05 | | 13.0 | 176 | 5.8 | 12.2 |
| Ex. 7 | 3.40 | | 0.1 | | | 0.885 | | 0.1 | | 15.0 | 193 | 5.8 | 12.2 |
| Ex. 8 | 3.20 | | 0.3 | | | 0.685 | | 0.3 | | 11.2 | 122 | 5.2 | 10.8 |
| Comp. 2 | 3.00 | | 0.5 | | | 0.485 | | 0.5 | | 8.3 | 36 | 5.2 | 11.0 |

"Relative ENG" in the right-side part of Table 2 shows relative light emission energy of the phosphor according to each example where the light emission energy of the phosphor according to the comparative example 1 is defined as 100%.

The phosphors according to the examples 1 to 4 are produced by partially substituting Ge of $GeO_2$ in the elements of the MGF phosphor with Ga. As shown in Table 2, the light emission values of the phosphors according to the examples 1 to 4 are increased by the substitution of Ge with Ga as compared with the comparative example 1. In addi- It is found that the light emission efficiency of the phosphor can be further increased by the substitution of Mg and Ge with Sc and Ga (co-substitution) as compared with the substitution of Ge with only Ga. The reason to further increase the light emission efficiency by the substitution of Mg and Ge with Sc and Ga can be considered that charge compensation effect is obtained by simultaneously substituting elements having different numbers of valence electrons with other elements having different numbers of valence electrons.

From in FIG. 2, it is found that the red phosphors according to the examples relatively efficiently absorb light in the wavelength range from 380 to 460 nm, which is a relatively low reflectance range as compared with other ranges, as compared with the comparative example 1. Also, from in FIG. 3, it is found that the red phosphors according to the examples are relatively efficiently excited by light in the wavelength range from 380 to 460 nm, which includes maximum values of their excitation spectrums, as compared with the comparative example 1. The low reflectance wavelength ranges of the red phosphors according to the examples are shifted toward the long wavelength side with respect to the comparative example 1. Also, maximum values of the excitation spectrums of the red phosphors according to the examples are shifted toward the long wavelength side with respect to the comparative example 1. From these viewpoints, the red phosphors according to the examples are suitable for light emitting devices using a light emitting element that emits blue light as their excitation light source as compared with the MGF phosphor as the comparative example 1.

Also, as shown in Table 2, the particle diameters of the red phosphors according to the examples fall within the range from 5 to 30 μm. In the case where the particle diameter of a phosphor falls within this range, the light emitting device can have good optical characteristics including low color unevenness and low color variation.

COMPARATIVE EXAMPLES 3 AND 4, AND EXAMPLES 9 TO 15

Phosphors according to examples 9 to 15 and comparative examples 3 and 4 are produced similarly to the same method as the foregoing examples except for modifications of the materials and the ratio of the elements to obtain the compositions shown in Table 3.

TABLE 3

|  | Sub. Elem. | Composition Formula |
|---|---|---|
| Ex. 9 | Sc, Ga | $3.65MgO \cdot 0.05Sc_2O_3 \cdot 0.25MgF_2 \cdot 0.885GeO_2 \cdot 0.05Ga_2O_3:0.015Mn^{4+}$ |
| Ex. 10 | Sc, Ga | $3.15MgO \cdot 0.05Sc_2O_3 \cdot 0.75MgF_2 \cdot 0.885GeO_2 \cdot 0.05Ga_2O_3:0.015Mn^{4+}$ |
| Ex. 11 | Sc, Ga | $2.9MgO \cdot 0.05Sc_2O_3 \cdot 1.0MgF_2 \cdot 0.885GeO_2 \cdot 0.05Ga_2O_3:0.015Mn^{4+}$ |
| Ex. 12 | Sc, Ga | $2.65MgO \cdot 0.05Sc_2O_3 \cdot 1.25MgF_2 \cdot 0.885GeO_2 \cdot 0.05Ga_2O_3:0.015Mn^{4+}$ |
| Comp. 3 | Sc, Ga | $2.4MgO \cdot 0.05Sc_2O_3 \cdot 1.5MgF_2 \cdot 0.885GeO_2 \cdot 0.05Ga_2O_3:0.015Mn^{4+}$ |
| Ex. 13 | Sc, Ga | $3.4MgO \cdot 0.05Sc_2O_3 \cdot 0.885GeO_2 \cdot 0.05Ga_2O_3:0.005Mn^{4+}$ |
| Ex. 14 | Sc, Ga | $3.4MgO \cdot 0.05Sc_2O_3 \cdot 0.885GeO_2 \cdot 0.05Ga_2O_3:0.01Mn^{4+}$ |
| Ex. 15 | Sc, Ga | $3.4MgO \cdot 0.05Sc_2O_3 \cdot 0.885GeO_2 \cdot 0.05Ga_2O_3:0.03Mn^{4+}$ |
| Comp. 4 | Sc, Ga | $3.4MgO \cdot 0.05Sc_2O_3 \cdot 0.885GeO_2 \cdot 0.05Ga_2O_3:0.05Mn^{4+}$ |

<Measurement Results of Powder Characteristics>

Table 4 shows the measurement results of the powder characteristics of the comparative examples 3 and 4, and the examples 9 to 15.

TABLE 4

| | Change in Composition ||||||| Powder Characteristics ||||
| | Mole Ratio (mol) ||||||| | 440 nm |||
| | MgO-Site ||| | GeO$_2$-Site || | | Rel. | Persistence ||
| | MgO | Sub. | MgF$_2$ | CaF$_2$ | GeO$_2$ | Sub. | Mn$^{4+}$ | Mean | ENG | | |
| | x-a | Elem. | a | y | c | 1-b | Elem. | b | z | Dia./μm | (%) | 1/10 | 1/100 |
| Ex. 9 | 3.65 | Sc | 0.1 | 0.25 | — | 0.885 | Ga | 0.1 | 0.015 | 11.2 | 167 | 5.2 | 11 |
| Ex. 10 | 3.15 | | | 0.75 | | | | | | 11.0 | 194 | 5.8 | 12 |
| Ex. 11 | 2.9 | | | 1.0 | | | | | | 8.6 | 174 | 5.8 | 12 |
| Ex. 12 | 2.65 | | | 1.25 | | | | | | 5.6 | 152 | 5.8 | 12 |
| Comp. 3 | 2.4 | | | 1.5 | | | | | | 5.5 | 86 | 5.2 | 11 |
| Ex. 13 | 3.4 | Sc | 0.1 | 0.5 | — | 0.885 | Ga | 0.1 | 0.005 | 15.0 | 162 | 5.6 | 11.8 |
| Ex. 14 | | | | | | | | | 0.01 | 13.6 | 180 | 5.6 | 11.8 |
| Ex. 15 | | | | | | | | | 0.03 | 14.0 | 163 | 5.0 | 10.4 |
| Comp. 4 | | | | | | | | | 0.05 | 13.6 | 61 | 2.8 | 6.4 |

The phosphors according to the examples 9 to 12, and the comparative example 3 are produced by partially substituting fixed contents of Mg of MgO and Ge of GeO$_2$ in the elements of the MGF phosphor with Sc and Ga, respectively, irrespective of the examples but changing the content of MgF$_2$. It is found that the light emission energy of the phosphor according to the comparative example 3 having a large content of MgF$_2$ is low. In the case of the contents of MgF$_2$ of the examples 9 to 12, the persistence time can be reduced as compared with the comparative example 1 while increasing the light emission energy.

The contents of Mn of phosphors according to examples 13 to 15 and a comparative example 4 are changed from the example 13 as the smallest content. It is found that the light emission energy of the phosphor according to the comparative example 4 having a large content of Mn is low. In the case of the contents of Mn of the examples 13 to 15, the persistence time can be reduced as compared with the comparative example 1 while increasing the light emission energy.

EXAMPLES 16 TO 19

Phosphors according to examples 16 to 19 are produced similarly to the same method as the foregoing examples except for modifications of the materials and the ratio of the elements to obtain the compositions shown in Table 5.

TABLE 5

| | Sub. Elem. | Composition Formula |
|---|---|---|
| Ex. 16 | Sc, Al | 3.4MgO•0.05Sc$_2$O$_3$•0.5MgF$_2$•0.885GeO$_2$•0.05Al$_2$O$_3$:0.015Mn$^{4+}$ |
| Ex. 17 | Sc, Ga | 3.0MgO•0.05Sc$_2$O$_3$•0.85MgF$_2$•0.05CaF$_2$•0.885GeO$_2$•0.05Ga$_2$O$_3$:0.015Mn$^{4+}$ |
| Ex. 18 | Sc, Ga | 3.0MgO•0.05Sc$_2$O$_3$•0.65MgF$_2$•0.25CaF$_2$•0.885GeO$_2$•0.05Ga$_2$O$_3$:0.015Mn$^{4+}$ |
| Ex. 19 | Sc, Ga | 3.0MgO•0.05Sc$_2$O$_3$•0.15MgF$_2$•0.75CaF$_2$•0.885GeO$_2$•0.05Ga$_2$O$_3$:0.015Mn$^{4+}$ |

<Measurement Results of Powder Characteristics>

Table 6 shows the measurement results of the powder characteristics of the examples 16 to 19.

TABLE 6

| | Change in Composition | | | | | | | Powder Characteristics | | | |
|---|---|---|---|---|---|---|---|---|---|---|---|
| | Mole Ratio (mol) | | | | | | | | 440 nm | | |
| | MgO-Site | | | | GeO$_2$-Site | | | | Rel. | | |
| | MgO | Sub. | MgF$_2$ | CaF$_2$ | GeO$_2$ | Sub. | Mn$^{4+}$ | Mean | ENG | Persistence | |
| | x-a | Elem. | a | y | c | 1-b | Elem. | b | z | Dia./μm | (%) | 1/10 | 1/100 |
| Ex. 16 | 3.4 | Sc | 0.1 | 0.5 | — | 0.885 | Al | 0.1 | 0.015 | 11.8 | 159 | 5.4 | 11.4 |
| Ex. 17 | 3.0 | | | 0.85 | 0.05 | | Ga | | | 14.2 | 208 | 6.2 | 12.8 |
| Ex. 18 | | | | 0.65 | 0.25 | | | | | 12.2 | 210 | 5.6 | 11.6 |
| Ex. 19 | | | | 0.15 | 0.75 | | | | | 7.9 | 143 | 4.6 | 9.8 |

The phosphor according to the example 16 is produced by partially substituting Ge of GeO$_2$ in the elements of the MGF phosphor with Al, which is a trivalent element having three valence electrons similar to Ga. It is found that the light emission energy of the phosphor according to the example 16 is increased, and the persistence time of the phosphor according to the example 16 is reduced similar to the phosphors according to the examples that are subjected to the substitution of Ge with Ga as compared with the comparative example 1.

The phosphors according to the examples 17 to 19 are produced by adding CaF$_2$ into the component of the MGF phosphor. The light emission energy is further increased, and the persistence time is reduced by the addition of CaF$_2$ as compared with the comparative example 1. Therefore, it is found that the light emission characteristics are improved by the addition of CaF$_2$. Also, it is found that the light intensity of the phosphor can be greatly increased in the case where c satisfies 0.05≤c≤0.25 in the above general formula (I).

Figure 7:
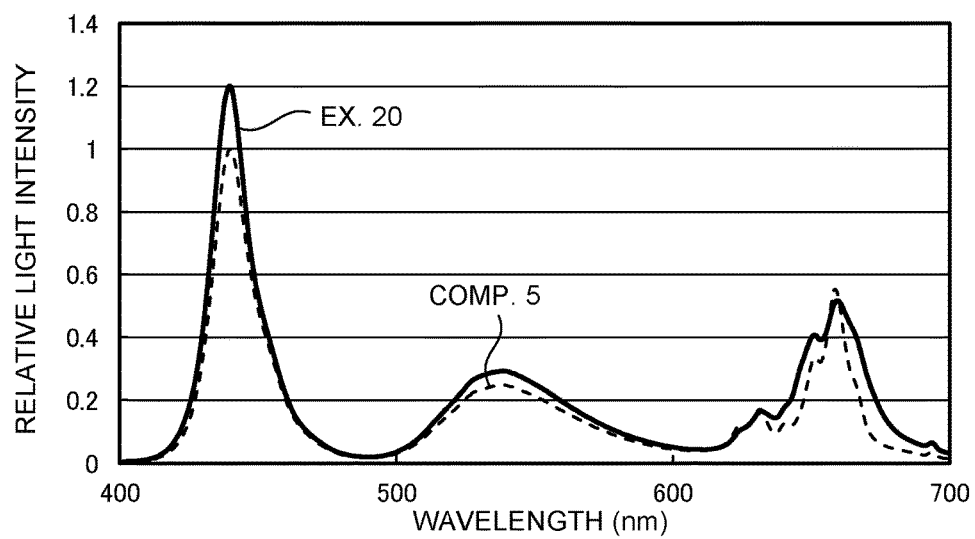
FIG. 7 is a graph showing the light emission spectrums of light emitting devices including the red phosphor according to the example of the present invention, and the comparative example.

Table 7 shows the evaluation results of the characteristics of light emitting devices according to an example 20 and a comparative example 5. The light emitting device according to the example 20 includes the phosphor according to the example 7, and a β-SIALON phosphor (Si$_{6-z}$Al$_z$N$_{8-z}$:Eu (z=0.2)). The light emitting device according to the comparative example 5 includes the phosphor according to the comparative example 1, and the β-SIALON phosphor (Si$_{6-z}$Al$_z$N$_{8-z}$:Eu (z=0.2)). Surface mount type light emitting devices are produced as the light emitting devices, which include a light emitting element having a size of 500×290 μm and a light emission peak wavelength of 445 nm for exciting the phosphor of the example 7 or the comparative example 1. X and y shows the chromaticity coordinates of the light emitting device, while the relative luminous flux ratio shows a relative luminous flux value where the luminous flux of the light emitting device according to the comparative example 5 is defined as 100. The luminous flux of the light emitting device is measured by an integrating sphere type total-luminous-flux measuring device. FIG. 7 is a graph showing the light emission spectrums of light emitting devices using the phosphor according to the example of the present invention, and the comparative example. In FIG. 7, the solid line, and the dashed line show the example 20, and the comparative example 5, respectively.

From Table 7, it is found that the luminous flux of the light emitting device according to the example 20 is higher than the comparative example 5. Also, from FIG. 7, it is found that the relative light intensity of the light emitting device according to the example 20 is increased throughout its light emission spectrum as compared with the comparative example 5. In addition, the persistence time of the phosphor according to the example 7, which is included in the light emitting device according to the example 20, is shorter than the phosphor according to the comparative example 1 as is shown in Table 2. That is, the light emitting device according to the example 20 is useful for backlight uses in liquid crystal displays.

TABLE 7

| | Phosphor | x | y | Rel. Flux |
|---|---|---|---|---|
| Comp. 5 | Comp. 1 | 0.250 | 0.220 | 100 |
| Ex. 20 | Ex. 7 | 0.250 | 0.220 | 117.4 |

Figure 8:
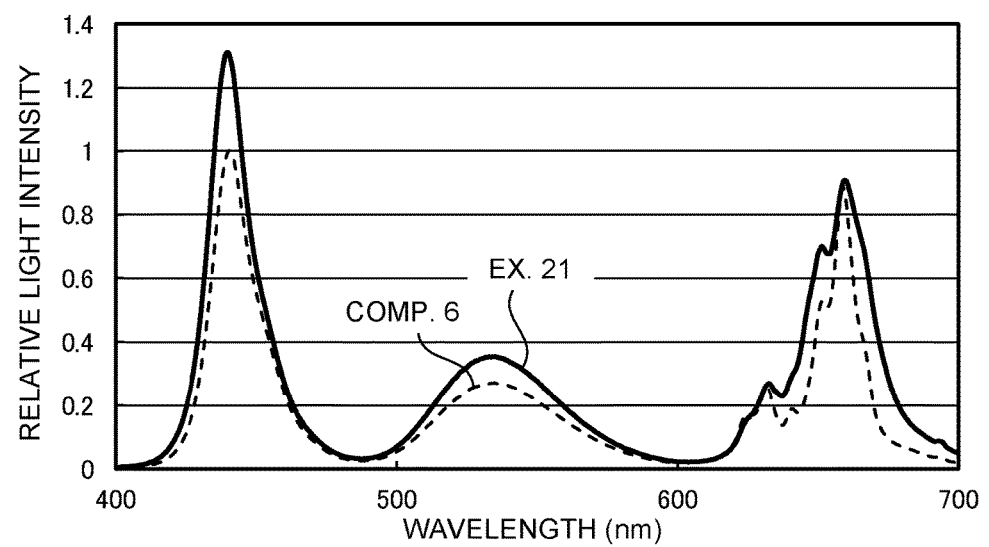
FIG. 8 is a graph showing the light emission spectrums of light emitting devices including the red phosphor according to the example of the present invention, and the comparative example.

Table 8 shows the evaluation results of the characteristics of light emitting devices according to an example 21 and a comparative example 6. The light emitting device according to the example 21 includes the phosphor according to the example 7, and $SrGa_2S_4$:Eu. The light emitting device according to the comparative example 6 includes the phosphor according to the comparative example 1, and $SrGa_2S_4$:Eu. Surface mount type light emitting devices are produced as the light emitting devices, which include a light emitting element having a size of 500×290 μm and a light emission peak wavelength of 445 nm for exciting the phosphor. X and y shows the chromaticity coordinates of the light emitting device, while the relative luminous flux ratio shows a relative luminous flux value where the luminous flux of the light emitting device according to the comparative example 6 is defined as 100. The luminous flux of the light emitting devices according to the example 21 and the comparative example 6 is measured similarly the foregoing comparative example 5 and the example 20. FIG. 8 is a graph showing the light emission spectrums of light emitting devices using the phosphor according to this example, and the comparative example. In FIG. 8, the solid line, and the dashed line show the example 21, and the comparative example 6, respectively.

From Table 8, it is found that the luminous flux of the light emitting device according to the example 21 is further increased as compared with the comparative example 6. Also, from FIG. 8, it is found that the relative light intensity of the light emitting device according to the example 21 is increased throughout its light emission spectrum as compared with the comparative example 6. In addition, the persistence time of the phosphor according to the example 7, which is included in the light emitting device according to the example 21, is shorter than the phosphor according to the comparative example 1 as is shown in Table 2. That is, the light emitting device according to the example 21 is useful for backlight uses in liquid crystal displays.

TABLE 8

| | Phosphor | x | y | Rel. Flux |
|---|---|---|---|---|
| Comp. 6 | Comp. 1 | 0.250 | 0.220 | 100 |
| Ex. 21 | Ex. 7 | 0.250 | 0.221 | 128.6 |

According to the present invention, a red phosphor according the present invention can be provided which can be excited by light having a peak wavelength in the range from near-ultraviolet light to visible light. In addition, a light emitting device capable of efficiently emitting red light can be provided by using the red phosphor according the present invention together with a lamp that emits ultraviolet light for exciting the red phosphor, or a light emitting diode that emits near-ultraviolet light or visible light. Also, a light emitting device or display capable of emitting a desired mixed color selected from various colors including white light can be provided by using the red phosphor according the present invention together with other phosphors, and the like.

What is claimed is:

1. A light emitting device comprising:
   an excitation light source that emits light having a peak wavelength in the range from near-ultraviolet to blue light;
   a first phosphor that can absorb a part of the light from said excitation light source and can emit luminescent radiation, the first phosphor having a general formula:

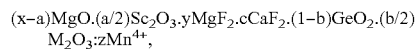

in which x, y, z, a, b, and c satisfy 2.0≤x≤4.0, 0<y<1.5, 0<z<0.05, 0≤a<0.5, 0<b<0.5, 0≤c<1.5, and y+c<1.5, and M is at least one element selected from the group consisting of Al, Ga, and In; and
   a second phosphor that can absorb a part of the light from said excitation light source and can emit luminescent radiation with a peak wavelength different from said first phosphor, the second phosphor comprising at least one selected from the group consisting of $(Ca, Sr, Ba)_2Si_5N_8$:Eu, $(Ca, Sr)AlSiN_3$:Eu, $Lu_3Al_5O_{12}$:Ce, $(Ca, Sr, Ba)_8MgSi_4O_{16}Cl_2$:Eu, $(Ba, Sr, Ca)_3MgSi_2O_8$:Eu, $BaMgAl_{10}O_{17}$:Eu, and $(Ca, Sr)_5(PO_4)_3(F, Cl, Br)$:Eu.

2. The light emitting device according to claim 1, wherein a persistence time from a reference point to a point at which the light intensity of the first phosphor becomes ⅒ of the light intensity at the reference point is not greater than 6.5 milliseconds.

3. The light emitting device according to claim 1, wherein a persistence time from a reference point to a point at which the light intensity of the first phosphor becomes 1/100 of the light intensity at the reference point is not greater than 13.5 milliseconds.

4. The light emitting device according to claim 1, wherein b satisfies 0.05≤b<0.5.

5. The light emitting device according to claim 1, wherein a and b satisfy 0.05≤a≤0.3, and 0.05≤b<0.3.

6. The light emitting device according to claim 1, wherein a particle diameter of the first phosphor falls within the range from 5 to 30 μm.

7. The light emitting device according to claim 1, wherein the first phosphor includes a crystal phase, wherein a percentage of the crystal phase is not less than 50% by weight.

* * * * *